United States Patent
Lamy

(10) Patent No.: US 7,249,311 B2
(45) Date of Patent: Jul. 24, 2007

(54) METHOD END DEVICE FOR SOURCE DECODING A VARIABLE-LENGTH SOFT-INPUT CODEWORDS SEQUENCE

(75) Inventor: Catherine Lamy, Paris (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/527,107

(22) PCT Filed: Sep. 4, 2003

(86) PCT No.: PCT/IB03/03870

§ 371 (c)(1),
(2), (4) Date: Mar. 8, 2005

(87) PCT Pub. No.: WO2004/025840

PCT Pub. Date: Mar. 25, 2004

(65) Prior Publication Data

US 2006/0061498 A1    Mar. 23, 2006

(30) Foreign Application Priority Data

Sep. 11, 2002  (EP)  .................... 02292223

(51) Int. Cl.
*H03M 13/03* (2006.01)
(52) U.S. Cl. .................................... 714/796
(58) Field of Classification Search ............ 714/774, 714/796
See application file for complete search history.

(56) References Cited

U.S. PATENT DOCUMENTS

| | | | | |
|---|---|---|---|---|
| 4,797,887 A | * | 1/1989 | Yamasaki et al. | 714/791 |
| 6,246,347 B1 | * | 6/2001 | Bakhmutsky | 341/67 |
| 6,851,083 B1 | * | 2/2005 | Hagenauer et al. | 714/774 |
| 6,891,484 B2 | * | 5/2005 | Lamy et al. | 341/67 |
| 2001/0007578 A1 | * | 7/2001 | Ran et al. | 375/253 |
| 2004/0259098 A1 | * | 12/2004 | Lamy et al. | 435/6 |

OTHER PUBLICATIONS

Sivasankaran et al. Twin-Stack Decoding of Recursive Systematic Convolutional codes, IEEE transactions on communications, vol. 49. No. 7, Jul. 2001 , pp. (1158-1167).*

(Continued)

*Primary Examiner*—Albert Decady
*Assistant Examiner*—Sam Rizk
(74) *Attorney, Agent, or Firm*—Michael E. Belk; Paul Im

(57) ABSTRACT

The invention concerns a method for source decoding a variable-length soft-input codewords sequence (y [1:T]) into a soft-out-put bit sequence (Lv [1:T]), the variable-length soft-input input code-words sequence (y [1:T]) encoded in accordance with a VLC codewords table. It comprises—a first stage (100) of implementing a stack decoding algorithm for a sequential estimation of an hard-output bit sequence of said variable length soft-input codewords sequence, including storage of intermediate data contained in the stack and generated by the stack decoding algorithm; and—a second subsequent stage (102) of post-processing the stored intermediate data for generating the soft-output bit sequence (Lv [1:T]), a soft-output (L(x [t])) being provided for each bit.

16 Claims, 7 Drawing Sheets

OTHER PUBLICATIONS

L. Perros-Meilhac & C. Lamp; "Huffmann tree based metric derivation for a low-complexity sequential soft VLC decoding". Proc. ICC'02, vol. 2 pp. 783-787, NY USA, May 2002.

Buttigieg: "Variable-length error-correcting codes" PhD thesis, Univ. of Manchester, UK, 1995.

L. Bahl, J. Cocke, F. Jelinek, & J. Raviv. "Optimal decoding of linear codes for minimizing symbol error rate". IEEE Transactions on Information Theory, 20:284-287, Mar. 1974.

L. Guivarch et al. "Joint source-channel soft decoding of Huffman codes with turbo-codes" Proc. of the data Comp. Conf. (DCC'00), pp. 89-91, Snowbird Utah, USA Mar. 2000.

* cited by examiner

| Symbol | Codewords | Lenght | Probability P |
|---|---|---|---|
| $S_1$ | 0 | 1 | 0,5 |
| $S_2$ | 10 | 2 | 0,3 |
| $S_3$ | 11 | 2 | 0,2 |

METHOD END DEVICE FOR SOURCE DECODING A VARIABLE-LENGTH SOFT-INPUT CODEWORDS SEQUENCE

FIELD OF THE INVENTION

The present invention relates to a method for source decoding a variable-length soft-input codewords sequence into a soft-output bit sequence.

Such a method may be used in any system using variable-length codes like, for example, a video or audio communication system.

BACKGROUND OF THE INVENTION

A video communication system typically comprises a source encoding system, a channel and a source decoding system. The source encoding system generates variable-length codewords sequences and transmits them over the channel to the source decoding system that decodes them thanks to a shared code.

Variable-length codes, which are widely used in video coding standards for their compression capabilities are very sensitive to channel errors. As a matter of fact, when some bits are altered by the channel, synchronisation losses can occur at the receiver side, possibly leading to dramatic symbol error rates. This phenomenon has led to introduce modified variable-length codes such as e.g. self-synchronising Huffman codes, reversible variable-length codes.

Another solution is to re-introduce redundancy in the bitstream by inserting an error correcting code in the chain. The key point of the latter solution is to appropriately use the residual source redundancy at the decoding side. Being considered as a form of implicit channel protection by the decoder, this redundancy can be exploited as such to provide error correction capability of the variable length coded source.

Recent work showed that low-complexity approximate MAP (Maximum A Posteriori) decoders could be used, that provide approximately the same performance as all existing soft decoding algorithms while exhibiting a complexity close to the hard decoding case. Such a decoder is disclosed in [L. Perros-Meilhac and C. Lamy. "Huffmann tree based metric derivation for a low-complexity sequential soft VLC decoding". In Proceedings of ICC'02, volume 2, pages 783–787, New York, USA, April–May 2002].

Even though MAP algorithms exist and provide very good results in terms of error correction, they are very complex. On the other hand, stack algorithms, as the one disclosed in [Buttigieg:"Variable-length error-correcting codes" PhD thesis, University of Manchester, United Kingdom, 1995] are much less complex and can reach similar performance. However, they are primarily symbol level decoding algorithms and thus are not well adapted to provide reliability information on bits.

The aim of the invention is to provide a method for source decoding a variable-length soft-input codewords sequence working at a bit level and at low complexity for VLC codes.

SUMMARY OF THE INVENTION

The subject matter of the invention is a method for source decoding a variable-length soft-input codewords sequence as defined in claim 1.

In addition, there is provided a source decoder for decoding a variable-length soft-input codewords sequence as defined in claim 10.

Additional features are disclosed in the other claims.

As we will see in detail further on, such a method has the advantage to provide a reliability information (or soft-output) on the decoded sequences, allowing to select paths in a tree in an increasing order of their metric value. Thus, by searching for only useful codewords, the proposed method is very efficient in term of CPU cost, complexity and time, as many other paths in the decoding tree are not considered anymore. The soft-output information allows then to perform iterative joint decoding when the VLC encoder has been concatenated with another.

BRIEF DESCRIPTION OF THE DRAWINGS

The invention will be better understood from reading the following description which is given solely by way of example and in which reference is made to the drawings, in which.

DETAILED DESCRIPTION OF THE INVENTION

Figure 1:
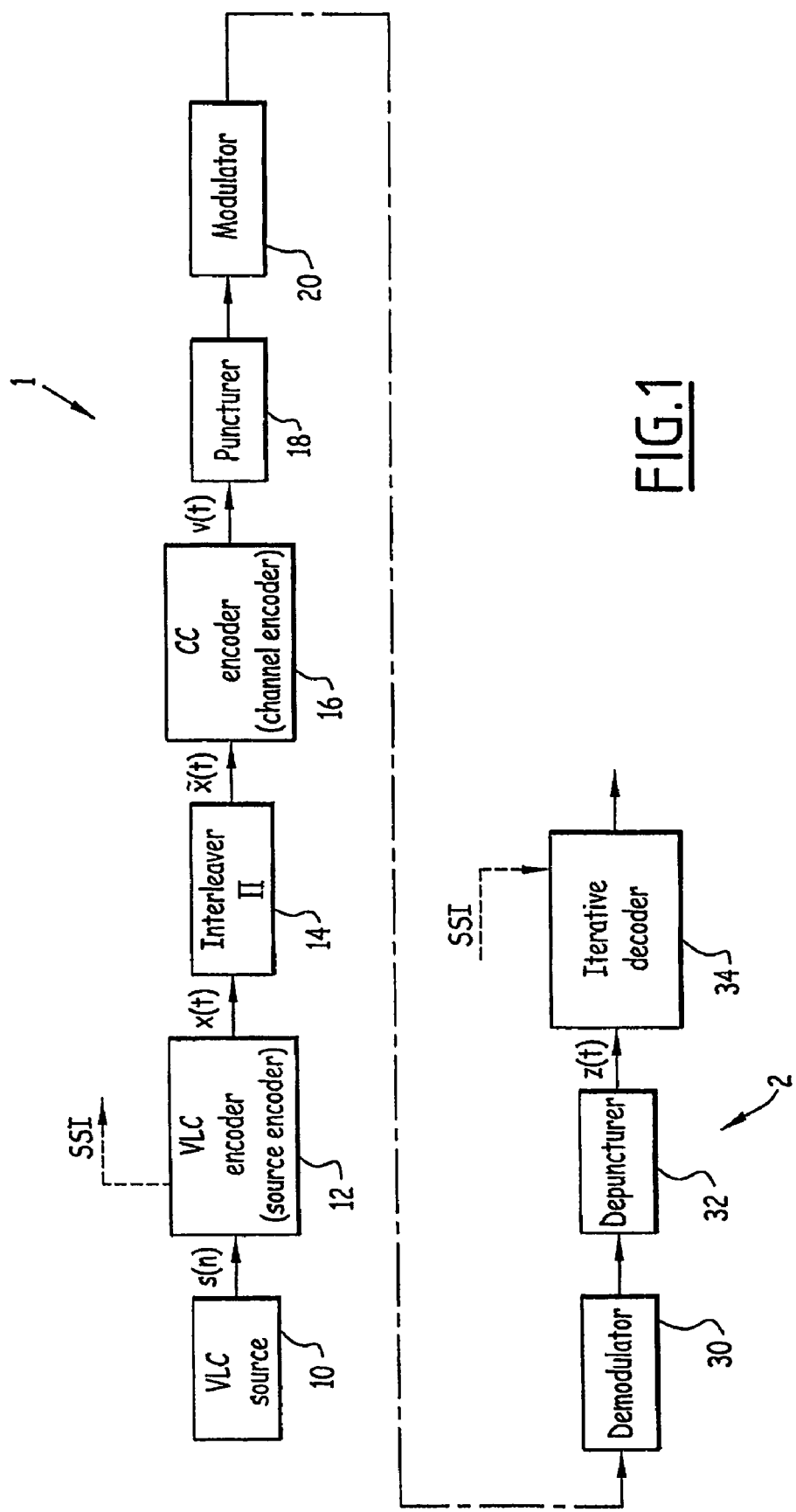
FIG. 1 is a general schematical view of a transmission chain, comprising an encoder and a decoder according to the invention.

A transmission chain for joint decoding between convolutional code and variable-length code is shown on FIG. 1.

This transmission chain comprises a transmitter 1 and a receiver 2.

Variable-lengths codes (VLC) are used in the transmission chain to reduce the length of the transmitted bitstreams.

The transmitter 1 includes a variable length source 10 which is adapted to output a random VLC symbols sequence s according to chosen VLC codewords probabilities.

At the output of the VLC source, the transmitter 1 comprises a variable length encoder 12, a pseudo-random interleaver 14, a systematic convolution (CC) encoder 16, a puncturer 18 and a BPSK modulator 20.

The random VLC symbols sequence s is encoded in the VLC encoder 12 which is a adapted to map the received symbols, for example grouped into packets of R symbols, to a T-bit VLC sequence denoted x [1:T]. The bit sequence x [1:T] is created, as known per se, following the rule edicted by a VLC table. An example of VLC table is given on FIG. 2.

In the VLC table, the code C is defined as follows. A codeword is associated with a symbol Si, a codeword having a predetermined length. A value of a codeword represents as well the value that can be taken by the associated symbol Si. Besides, to each codeword, a probability of appearance P $(S_k)$ is associated.

Each sequence x [1:T] is then permuted by the interleaver 14 to obtain an interleaved sequence x̃ [1:T].

This interleaved sequence x̃ [1:T] is given as input to the systematic convolutional encoder 16. The coded sequence denoted v [1:T x n/k] at the output of the CC encoder 16 is eventually punctured by the puncturer 18 in order to attain the wished transmission rate, modulated by the BPSK modulator 20 and transmitted over a channel with variance $\sigma^2$.

The receiver 2 includes a demodulator 30, an eventual depuncturer 32 and an iterative decoder or joint decoder 34.

The depuncturer 32 is adapted to introduce into the received sequence, a zero-value samples to replace the samples removed from the coded sequence by the puncturing operation. The depunctured sequence denoted z [1:T x n/k] is then decoded by the iterative decoder 34, the flowchart of which is detailed on FIG. 4.

Figures 2, 3:
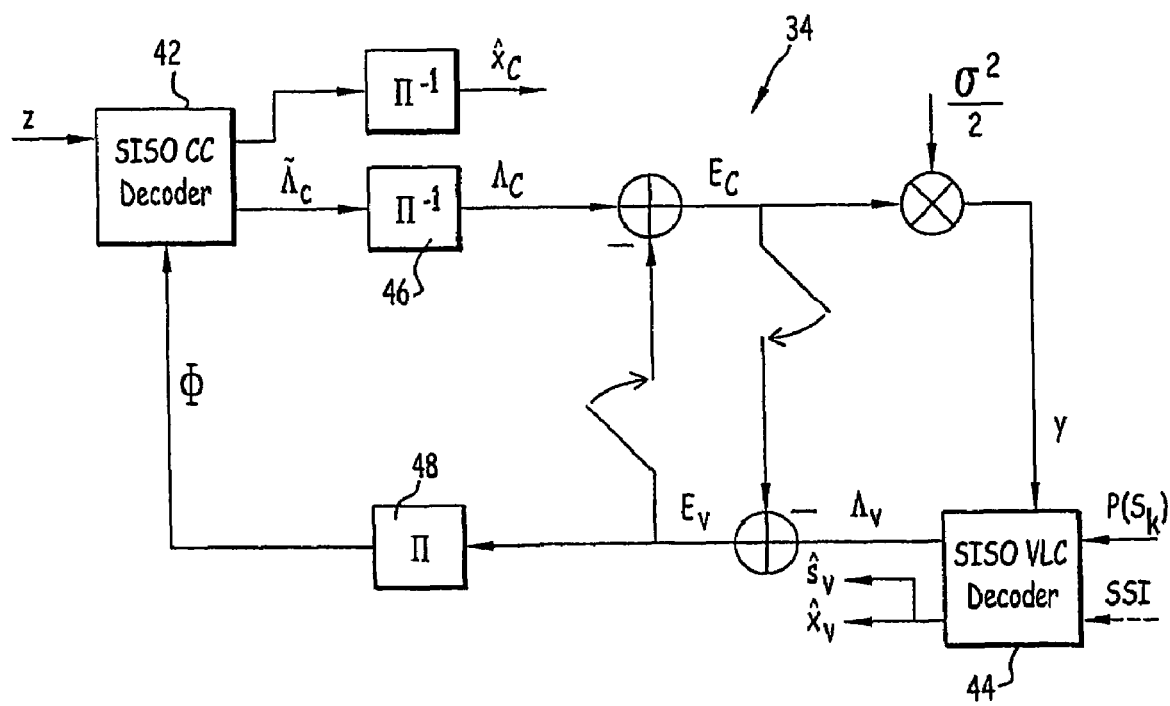
FIG. 2 is a VLC codewords table associated with the variable-length codewords sequences used in the encoder and the decoder of FIG. 1.
FIG. 3 is a detail view of a joint decoder of FIG. 1 including a decoder according to the invention.

As shown on FIG. 3, the iterative decoder 34 comprises a soft-input soft-output (SISO) CC decoder 42 and a soft-input soft-output (SISO) VLC decoder 44 according to the invention. The reliability information provided by the CC (resp. VLC) decoder is interleaved in 46 (resp 48) and is used to improve the decoding of the VLC (resp. CC) decoder.

The SISO CC decoder 42 is for example as disclosed in [L. Bahl, J. Cocke, F. Jelinek, and J. Raviv. "Optimal decoding of linear codes for minimizing symbol error rate". IEEE Transactions on Information Theory, 20:284–287, March 1974].

For decoding a sequence y [1:T], and as known per se, the SISO VLC decoder 44 is adapted to compute a soft-output in the form of the log a posteriori ratio $\Lambda(x[t])$:

$$\Lambda(x[t]) = \log\frac{P(x[t]=1\mid y[1:T])}{P(x[t]=0\mid y[1:T])} \text{ for } 1\le t \le T,$$

and a hard bit estimate sequence denoted $\hat{x}_v$ [1:T] or a hard symbol estimate sequence denoted $\hat{s}_v$ [1:R]. The hard symbol estimate sequence is derived from the hard bit estimate sequence by applying the VLC table.

The VLC SISO decoder 44 will derive the reliability information on bits $\Lambda$ (x[t]) by taking into account the a priori knowledge it had on the VLC encoder. In this case, the a priori knowledge will consist in a VLC tree structure derived from the VLC table, the occurrence probabilities of the symbols P $(S_k)$ and any other source side information denoted SSI, such as possibly the number of symbols of the concerned sequence.

A summary of the iterative decoding method is given hereafter.

1. Initialise $\Phi^{(0)}[t]=0$.
2. For iterations r=1, 2, . . . , I, where I is the total number of iterations compute $\tilde{\Lambda}_c^{(r)}$ [1:T] applying a SISO CC decoder using the depunctured received sequence z[1:T x n/k] as observation and $\Phi$ (r−1) [1:T] as a priori probabilities ratio, compute $E_c^{(r)}$ [t]=$\Lambda_c^{(r)}$ [t]−$E_v^{(r-1)}$ [t] for $1\le t\le T$, compute $$y^{(r)}[t] = \frac{\sigma^2}{2}E_C^{(r)}[t]$$

for $1\le t\le T$, compute $\Lambda_v^{(r)}$ [t] applying a SISO VLC decoder 44 using $y^{(r)}$ [1:T] as observation, compute $E_v^{(r)}$ [t]=$\Lambda_v^{(r)}$ [t]−$E_c^{(r)}$ [t] for $1\le t\le T$, and compute $\Phi^{(r)}[t]=\tilde{E}_v^{(r)}$ [t] for $1\le t\le T$.

More precisely, the iterative decoding process takes place as follows: At the $r^{th}$ iteration, the CC decoder's input consists in the depunctured sequence z[1:T x n/k] and the a priori probabilities ratio $\Phi^{(r-1)}$ [1:T] of the interleaved sequence denoted x̃ [1:T] obtained at previous iteration. The CC decoder 42 provides the $\tilde{\Lambda}_c^{(r)}$ [1:T] output sequence.

At this same $r^{th}$ iteration, the VLC decoder 44 takes as input the observation sequence $y^{(r)}$ [1:T] derived of the CC decoder output sequence, the a priori probabilities of VLC symbols as well as any other available source side information SSI and provides the $\Lambda_c^{(r)}$ [1:T] output sequence.

To have each decoder taking advantage of the iterative process, independent information must be exchanged between the two decoders, that is the so-called extrinsic information. $E_c^{(r)}$ [t] and $E_v^{(r)}$ [t] are defined as the extrinsic information about the bit t provided respectively by the CC decoder 42 and by the VLC decoder 44.

for $r\ge 1$, $E_c^{(r)}$ [t]=$\Lambda_c^{(r)}$ [t]−$E_v^{(r-1)}$ [t], $E_v^{(r)}$ [t]=$\Lambda_v^{(r)}$ [t]−$E_c^{(r)}$ [t], where $E_v^{(0)}$ [t] is set equal to zero.

The CC extrinsic information $E_c^{(r)}$ [1:T] sequence scaled by $\sigma^2/2$ is used as observation for the $r^{th}$ iteration of VLC decoder, thus $$y^{(r)}[t] = \frac{\sigma^2}{2}E_C^{(r)}[t].$$

The interleaved VLC extrinsic information $\tilde{E}_v^{(r)}$ [1:T] is used as a priori probabilities ratio estimate for the r+1$^{th}$ iteration of the CC decoder 42, $\Phi^{(r)}[t]=\tilde{E}_v^{(r)}$ [1:T].

Figure 4:
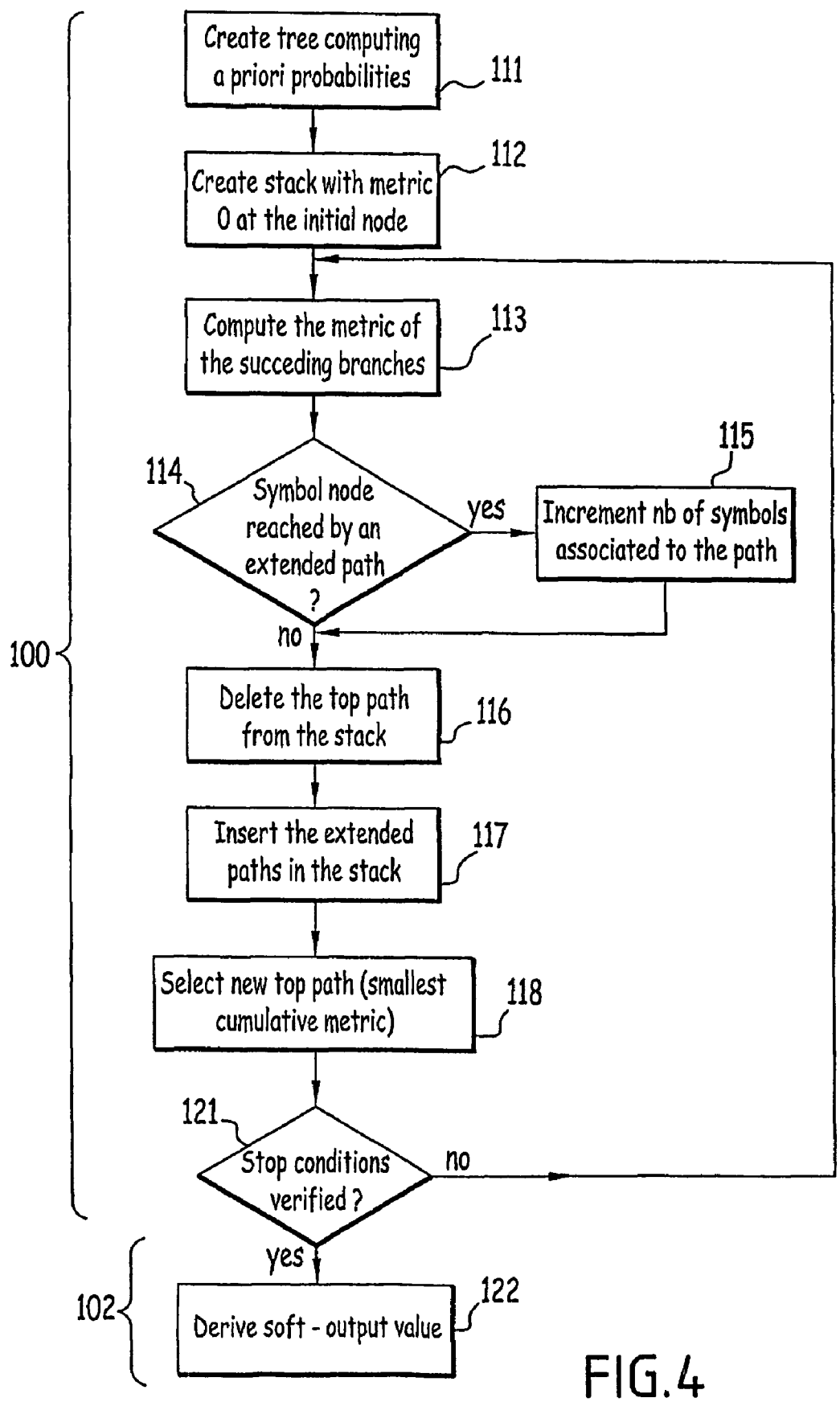
FIG. 4 is a flow chart of the soft-input soft-output variable-length codewords sequence decoding method according to the invention.

The SISO VLC decoder 44 implements a soft-input soft-output (SISO) stack method, the algorithm of which is disclosed on FIG. 4.

The method proceeds in two main stages:
- a hard decoding stage 100 for estimating an hard transmitted VLC sequence; and
- a post processing stage 102 for deriving the soft values.

The first main stage 100 of the method consists in applying a stack sequential decoding algorithm on a "huge" tree formed by concatenating several times a considered Huffman tree until for example the number of bits and the number of symbols in the considered sequence are reached.

Figure 5:
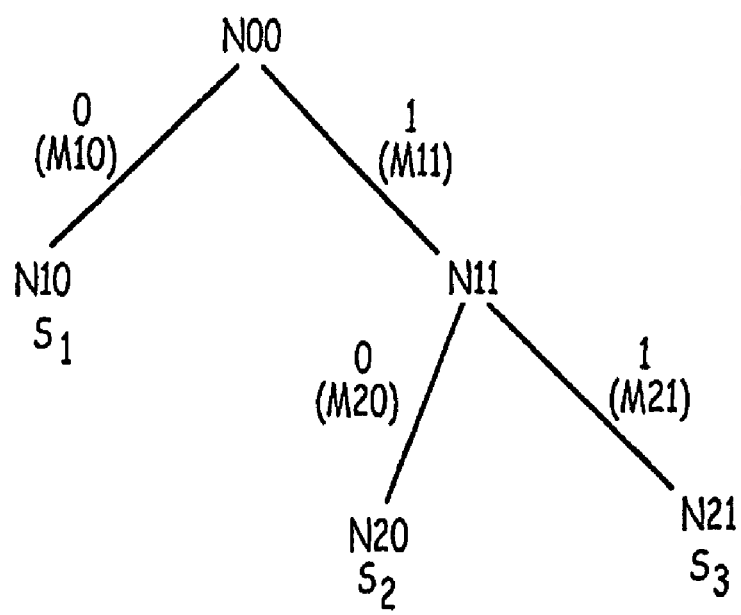
FIG. 5 is a representation of a tree associated with the VLC table of FIG. 2.

The first step 111 of the hard decoding stage 100 consists in creating a structure tree by defining relationships between nodes and computing an a priori probability associated with each branch of the tree. The unitary Huffman tree corresponding to VLC codes of FIG. 2 is shown on FIG. 5.

Such a tree comprises a plurality of:
nodes N, a plurality of nodes corresponding to a possible codeword or a symbol Si;

branches B, a metric M being associated with each branch B. A branch B is composed of two nodes N, in other words, from a node N, one or two branches can be created, a "left" branch and a "right" branch; a branch has an associated bit value 0 or 1;

paths, a path representing a decoded bit sequence.

A path comprises a plurality of branches B and goes from an initial node N00 to a succeeding node which may be a symbol Si.

Besides, a tree has different levels, the first one being the level 0.

At step 112, a stack is defined. This stack is memorized at each step of the hard decoding stage 100 in order to be later used during the post processing stage 102.

The stack contains:

a matrix containing selected "paths" i.e. the sequence of node indexes forming these paths, a vector of integers storing for each path in the stack the number of decoded bits up to the current time, a vector of integers storing for each path in the stack the number of decoded symbols up to the current time, and a vector of float storing for each path in the stack the associated cumulative metric.

The stack is initialised by placing the initial node N00 with metric 0 in the stack. Initial node N00 is considered as being the top path in the decoding stack.

At step 113, a metric of the succeeding branches of the last node of the top path is computed.

As sequential decoding methods compare sequences of different lengths, a specific metric is used. For each node 1 in the set $N_p$, the metric associated to the branch leading to this node at time t is defined as follows:

$$m(1, y[t]) = -\log P(y[t]|v(1)) - \log p_t(1) + \log P_0(y[t]).$$

$N_p$: the set of nodes having a predecessor, $p_t(1)$ $(1 \in N_p)$: the a priori probability of the branch reaching the node 1 at time t;

$v(1)$ $(1 \in N_p)$: the value of the branch reaching the node 1, $v(1) \in \{0,1\}$;

$P_0(y[t])$: a Fano-Massey metric which allows to compare fairly sequences of different lengths.

The term $p_t(1)$ will in practice be approximated by the a priori probability of the branch p(1) for simplicity reason. This last quantity can be directly obtained from the tree representation of the VLC table and the codeword probabilities which are assumed to be known by the decoder as explained in [L. Guivarch, J.-C. Carlach, and P. Siohan. "Joint source-channel soft decoding of Huffman codes with turbo-codes". In Proceedings of the Data Compression Conference (DCC'00), pages 83–91, Snowbird, Utah, USA, March 2000].

At step 114, a test is performed to determine whether an extended path reaches a symbol node. An extended path consists in the current path concatenated with a possible succeeding branch.

If such a symbol node is reached by an extended path, the number of symbols associated to this path is increased at step 115.

The increasing of the number of symbols consists in concatenating the considered unitary Huffmann tree corresponding to the VLC codes with the initial node at the symbol node reached by the extended path.

The top path is deleted from the stack at step 116. The top path is the path mentioned in the first line of the stack. It is also the path of the stack having the smallest cumulative metric.

The extended paths are then inserted in the stack at step 117.

The cumulative metric of each new top path is computed and stored in the stack. The cumulative metric is equal to the cumulative metric of the previous top path increased with the metric of the branch added to obtain the extended path.

At step 118, a new top path is selected. The new top path selected is the path of the stack having the smallest cumulative metric among the paths listed in the stack.

Next, it is checked if stop conditions are verified at step 121. The stop conditions are for example that the top path contains the number of bits and the number of symbols of the original sequence.

If stop conditions are verified at step 121, then step 122 is carried out. Otherwise, step 114 and followings are repeated.

During the hard decoding stage 100, the content of the stack is stored at each step.

At step 122 corresponding to post processing stage 102, soft-output values are derived from the cumulative metrics of paths considered in hard decoding stage 100 and stored in the stack. Post processing stage algorithm will be disclosed later.

An illustrated example of hard decoding stage 100 is given hereafter.

Step 111:creation of the structure tree by defining relationships between nodes computing the a priori probability associated with each branch.

Step 112:initialization of the stack

| Cumulative metric | Node | PTH | Nb of bits | Nb of symbols |
|---|---|---|---|---|
| 0 | N00 | PTH00 | 0 | 0 |

Step 113:computation of the metric of the succeeding branches of last node N00.

They are calculated as follows:

M(N00–N10)=M10

M(N00–N11)=M11.

Step 114:The extended path reaching node N10 reaches a symbol node. Thus, step 115 is implemented for node N10.

Figure 6:
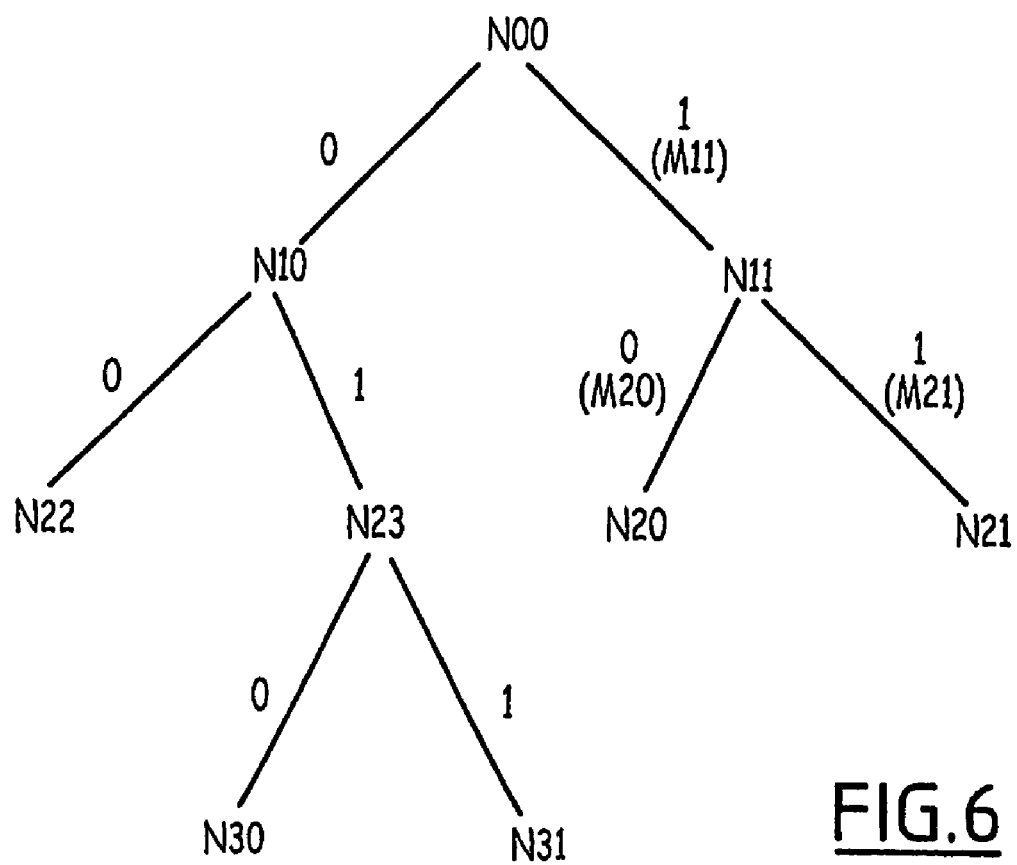
FIGS. 6, 7 and 8 are representations of concatenated code trees associated with the VLC table of FIG. 2 created during implementation of the decoding method according to the invention.

Step 115:concatenation of the considered unitary Huffmann tree with the initial node at the reached symbol node N10. The resulting tree is shown on FIG. 6.

Steps 116 & 117:deletion of the top path PTH00 from the stack and insertion of the extended paths in the stack

| Cumulative metric | Node | PTH | Nb of bits | Nb of symbols |
|---|---|---|---|---|
| M10 | N00-N10 | PTH10 | 1 | 1 |
| M11 | N00-N11 | PTH11 | 1 | 0 |

Step 118:selection of the new top path i.e. the path having the smallest cumulative metric.

(We assume that the smallest cumulative metric is M11)

| Cumulative metric | Node | PTH | Nb of bits | Nb of symbols |
|---|---|---|---|---|
| M11 | N00-N11 | PTH11 | 1 | 0 |
| M10 | N00-N10 | PTH10 | 1 | 1 |

Step 121:stop condition is assumed to be not verified.
Step 113:the last node of the top path is N11
The metric of the succeeding branches of last node of the top path are calculated as follows:

M(N11–N20)=M20

M(N11–N21)=M21.

Step 114:the extended paths reaching nodes N20 and N21 reach a symbol node, thus step 115 is implemented for nodes N20 and N21.

Figure 7:
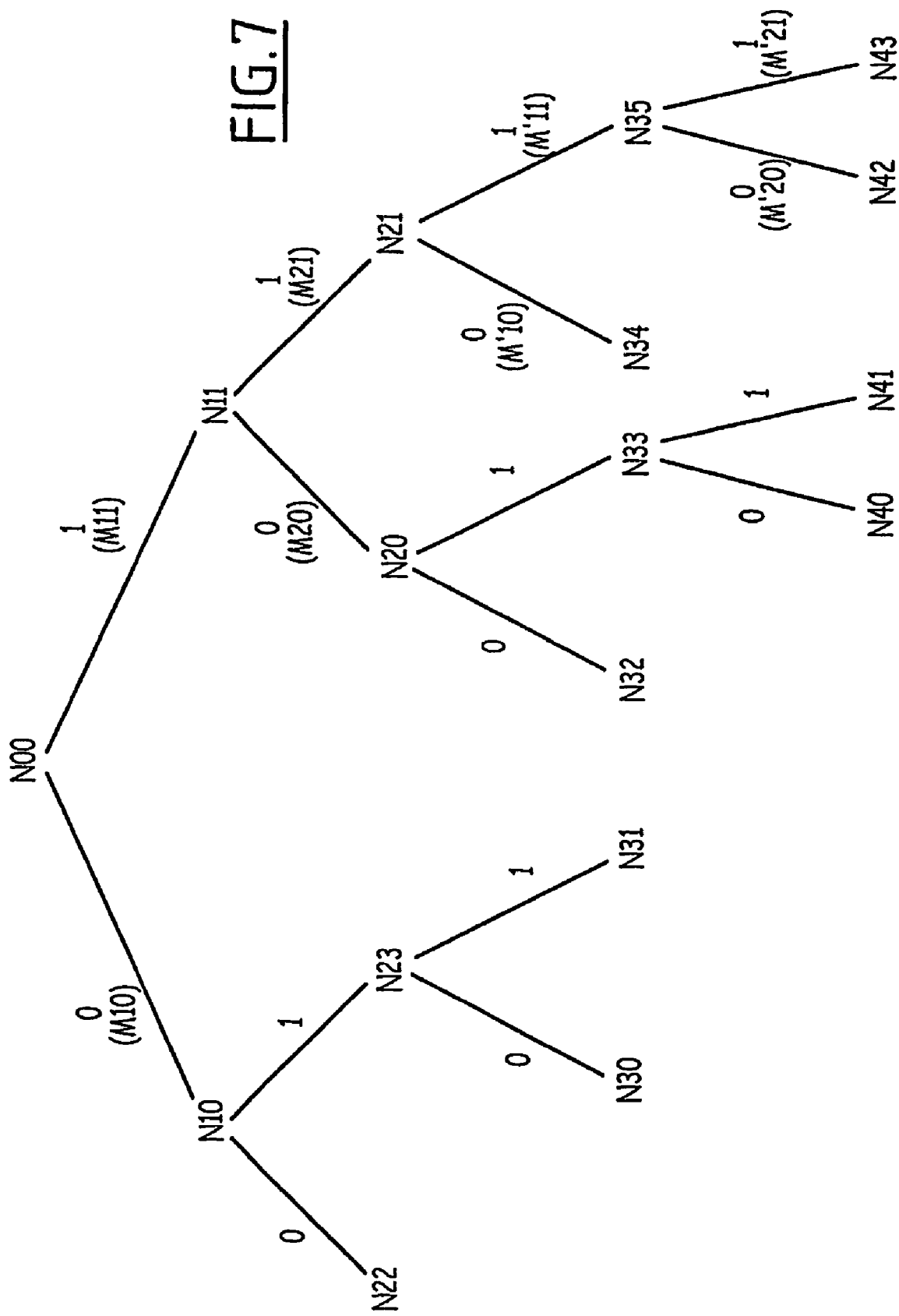

Step 115:concatenation of the considered unitary Huffman tree with the initial node at the reached symbol node N20 and N21. The resulting tree is shown on FIG. 7.

Steps 116 & 117:

| Cumulative metric | Node | PTH | Nb of bits | Nb of symbols |
|---|---|---|---|---|
| M10 | N00-N10 | PTH10 | 1 | 1 |
| M11 + M20 | N00-N11-N20 | PTH20 | 2 | 1 |
| M11 + M21 | N00-N11-N21 | PTH21 | 2 | 1 |

Step 118:selection of the new top path, i.e.:the path having the smallest cumulative metric.

(We assume that the smallest cumulative metric is M11+M21).

| Cumulative metric | Nodes | PTH | Nb of bits | Nb of symbols |
|---|---|---|---|---|
| M11 + M21 | N00-N11-N21 | PTH21 | 2 | 1 |
| M10 | N00-N10 | PTH10 | 1 | 1 |
| M11 + M20 | N00-N11-N20 | PTH20 | 2 | 1 |

Step 121:stop condition assumed not be verified.
Step 113:the last node of the top path is N21=N00. The metric of the succeeding branches of last node of the top path are calculated as follows:

M(N21–N34)=M'10

M(N21–N35)=M'11.

Step 114:the extended path reaching node N34 reaches a symbol node, thus step 115 is implemented for N34.

Figure 8:
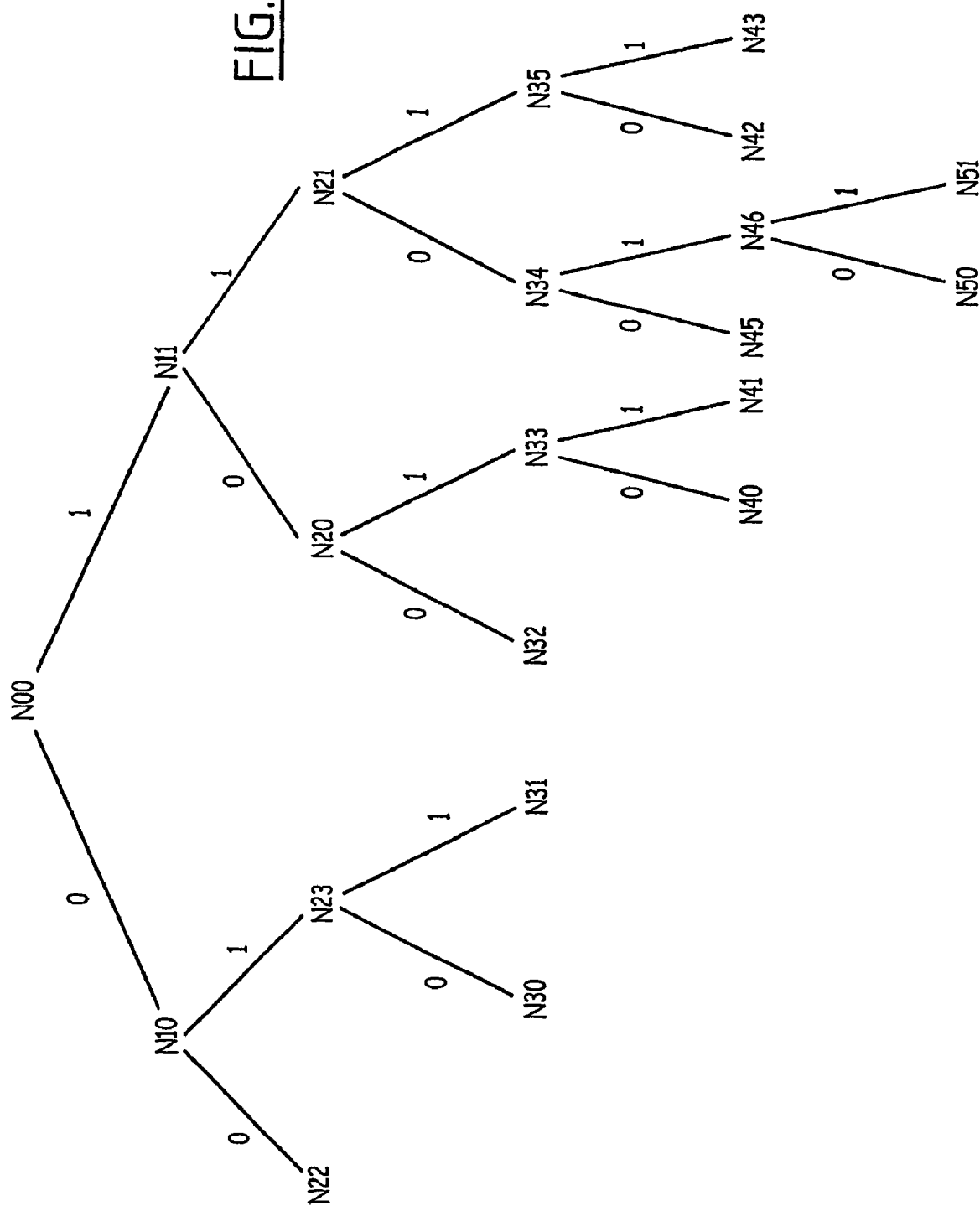

Step 115:concatenation of the considered unitary Huffman tree with the initial node N00 at the reached node N34 as shown on FIG. 8.

Steps 116 & 117:deletion of the top path PTH21 from the stack and insertion of the extended paths.

| Cumulative metric | Nodes (paths) | PTH | Nb of bits | Nb of symbols |
|---|---|---|---|---|
| M10 | N00-N10 | PTH10 | 1 | 1 |
| M11 + M20 | N00-N11-N20 | PTH20 | 2 | 1 |
| M11 + M21 + M'10 | N00-N11-N21-N34 | PTH34 | 3 | 2 |
| M11 + M21 + M'11 | N00-N11-N21-N35 | PTH35 | 3 | 1 |

Step 118:selection of the new top path i.e., the path having the smallest cumulative metric. (We assume that the smallest cumulative metric is M11+M20).

| Cumulative metric | Nodes (paths) | PTH | Nb of bits | Nb of symbols |
|---|---|---|---|---|
| M11 + M20 | N00-N11-N10 N00-N11-N20 | PTH20 | 2 | 1 |
| M10 | N00-N10 | PTH10 | 1 | 1 |
| M11 + M21 + M'10 | N00-N11-N21-N34 | PTH34 | 3 | 2 |
| M11 + M21 + M'11 | N00-N11-N21-N35 | PTH35 | 3 | 1 |

The steps as above disclosed are repeated until the stop conditions are verified at step 121.

Once the sequential decoding process is finished, the post-processing takes place and generates soft-outputs. These soft-outputs must consequently be extracted from the paths that have been examined and stored by the stack decoding algorithm.

Let $\{P_1, \ldots, P_r\}$ be the r examined paths stored in the stack. A given path $P_i$ ($1 \leq i \leq r$) is characterised by a length in bit $T^{Pi}$, a sequence of bits $\{\tilde{x}_{pi}[1], \ldots, \tilde{x}_{pi}[T^{P}_i]\}$ and a cumulative metric $\mu_{pi}$.

A first solution proposes to approximate the log-likelihood ratio $\Lambda(x[t])$ by:

$$\Lambda(x[t]) = \mu(t, 0) - \mu(t, 1),$$

where $\mu(t, 1)$ (resp. $\mu(t, 0)$) is the minimum cumulative metric for all the paths in the stack for which the $t^{th}$ estimated bit is 1 (resp. 0).

If P* is the path selected by the decoding process, then if $\tilde{x}P^*[t]=i(i=\{0, 1\})$, we have $$\mu(t,i) = \mu P^*.$$

As a consequence, for each time t, the minimum cumulative metric of the paths with complementary bit to the estimated sequence has only to be determined.

In a second solution, not only the best paths for both values 0 and 1 for $t^{th}$ estimated bit are taken into account, but all the metrics in the paths stored by the stack algorithm. So, the log-likelihood ratio $\Lambda(x[t])$ is approximated by $$\Lambda(x[t]) = \log\left(\Sigma e^{-\mu Pi}/\Sigma e^{-\mu Pi}\right)$$

Figure 9:
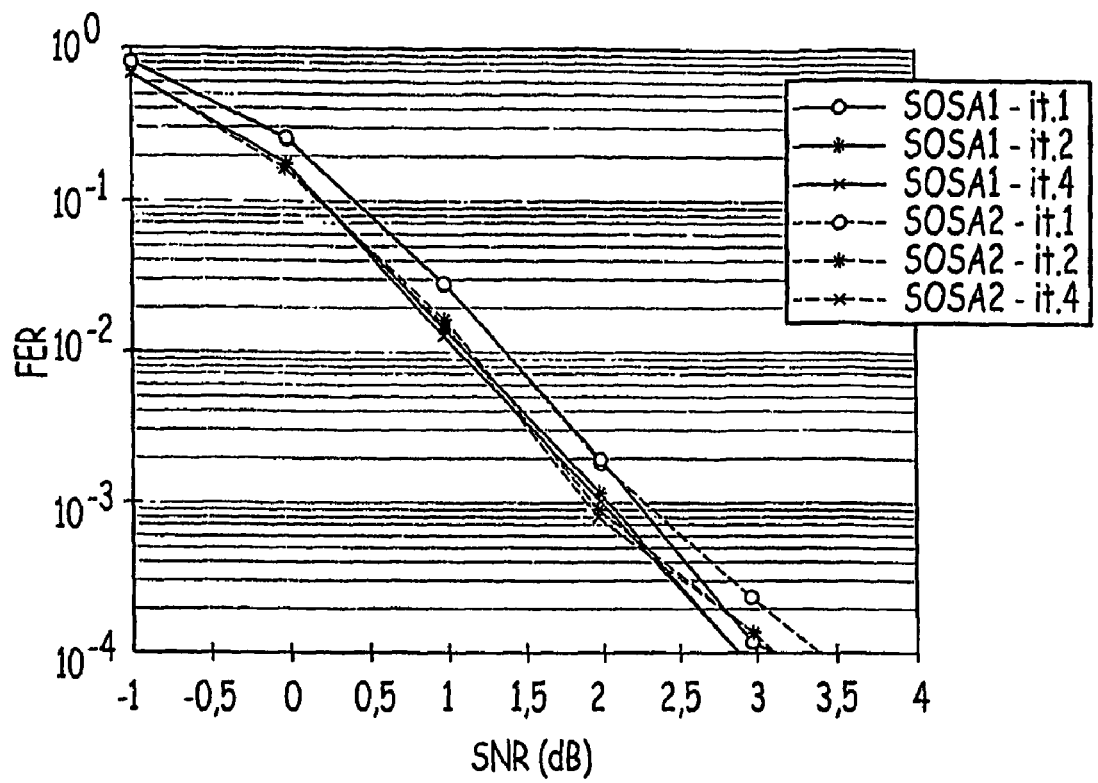
FIGS. 9 and 10 are graphs showing performances of the method according to the invention compared to other method.
Figure 10:
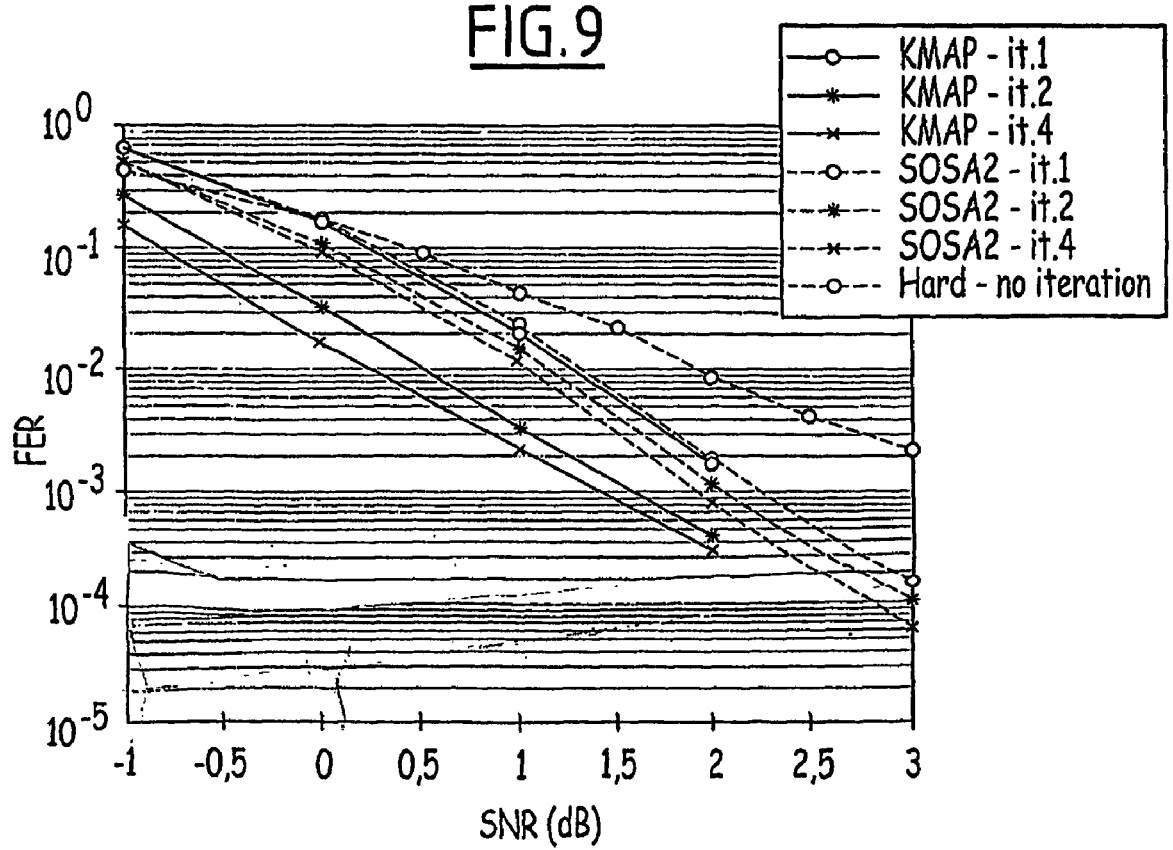

$1 \leq i \leq r \quad 1 \leq i \leq r$ $T_{Pi} \geq t \quad T_{Pi} \geq t$ $_{Pi}[t]=1 \quad \tilde{x}_{Pi}[t]=0$ FIGS. 9 and 10 show performance of the method according to the invention compared with other methods for source decoding of variable-length sequences.

The following method considered:Hard, which is the traditional hard-input VLC algorithm, without any a priori knowledge, KMAP, i.e. the MAP algorithm which consists in a Maximum A Posteriori decoding of VLC codes with exact a priori knowledge on the number of symbols by frame.

SOSA1 denotes the Soft Output Stack Algorithm using the first solution to generate soft output values.

SOSA2 denotes the Soft Output Stack Algorithm using the second solution to generate soft output values.

The following codes are considered in the communication chain:VLC code C given in Table 1 followed by convolutional code $CC_A$ with coded bits punctured using the puncturing table defined in Table 2. The results are given in terms of Frame Error Rate (FER) and Signal to Noise Ratio (SNR).

TABLE 1

Short VLC code used in the simulations.

| | Prob. | C |
|---|---|---|
| $S_1$ | 0.33 | 00 |
| $S_2$ | 0.30 | 11 |
| $S_3$ | 0.18 | 010 |
| $S_4$ | 0.10 | 101 |
| $S_5$ | 0.09 | 0110 |
| Average length | | 2.47 |

TABLE 2

Puncturing table used in the simulations: puncturing rate R = 8/9.

| 1 | 1 | 1 | 1 | 1 | 1 | 1 | 1 | 1 |
|---|---|---|---|---|---|---|---|---|
| 1 | 1 | 0 | 1 | 1 | 0 | 1 | 1 | 1 |

FIG. 9 first illustrates the performance of both SOSA1 and SOSA2 algorithms for the same chain at the output of the VLC decoder 44 for various iterations. The size of the stack is set to 20. The two different solutions proposed are roughly equivalent, with perhaps a very small advantage to SOSA2.

FIG. 10 shows a performance comparison between the KMAP and the SOSA2 algorithms for the same chain at the output of the VLC decoder 44 for various iterations. As foreseen by previous studies on hard outputs versions of these algorithms in particular [L. Perros-Meilhac and C. Lamy. "Huffmann tree based metric derivation for a low-complexity sequential soft VLC decoding". In Proceedings of ICC'02, volume 2, pages 783–787, New York, USA, April–May 2002], both perform similarly for the first iteration. However, the gain of about 0.8 dB obtained with KMAP algorithm for FER=$10^{-3}$ after 4 iterations is not completely reached with SOSA2 algorithm, which only provides about 0.3 dB of gain.

The stack algorithm in only about 0.5 dB worse than KMAP algorithm for a much lower complexity.

Yet, comparing these results with what would be obtained when replacing the SISO VLC decoders in the receiver by a classical hard VLC decoder (hence without iterating), the gain provided by the iteration process was found as being substantial.

The invention claimed is:

1. A method for source decoding a variable-length soft-input codewords sequence (y [1:T]) into a soft-output bit sequence ($\Lambda_v$ [1:T]), the variable-length soft-input input codewords sequence (y [1:T]) encoded in accordance with a VLC codewords table, the method comprising the acts of:

A. a first stage of implementing a stack decoding algorithm for a sequential estimation of a hard-output bit sequence of said variable length soft-input codewords sequence, wherein at each step of the sequential estimation, a stack of paths is reordered placing a current path having a smallest cumulative metric among paths listed in the stack at a top of the stack, including storage of intermediate data contained in the stack and generated by the stack decoding algorithm; and B. a second subsequent stage of post-processing the stored intermediate data for generating the soft-output bit sequence ($\Lambda_v$ [1:T]), a soft-output ($\Lambda$(x [t])) being provided for each bit.

2. The method according to claim 1, wherein the first stage of implementing the stack decoding algorithm comprises the acts of:

creating a unitary tree associated with said VLC codewords table, said unitary tree comprising nodes linked by branches, a path being defined by the branches from the initial node to each node of the tree;

implementing the following sub-steps from an initial node of the unitary tree by using the stack of paths, the stack having a current top path, each path being associated with a cumulative metric, the implementation being carried out until a set of stop conditions is verified:

Computing a metric M for each branch succeeding the current node of a current top path;

If the last node of the current top path corresponds to a codeword, concatenate the unitary tree with the current tree by placing the initial node of the unitary tree at least at the last node of the current top path;

Deleting the current top path from the stack;

Inserting, in the stack, new extended paths made of the current top path and the succeeding branches, the cumulative metric of the new extended path being computed for each extended paths as the metric of current top path increased by the metric of the associated succeeding branch; and Selecting the new current top path according to the cumulative metrics associated to the paths.

3. The method according to claim 2, wherein the metric associated to a branch leading to a node 1 at time t is defined as follows:

$$m(1, y[t]) = -\log P(y[t]|v(1)) - \log pt(1) + \log P0(y[t])$$

where Np:the set of nodes having a predecessor;

pt(1) (1 ∈ Np):the a priori probability of the branch reaching the node 1 at time t;

v(1) (1 ∈ Np):the value of the branch reaching the node 1, v(1) ∈ {0,1};

P0(y [t]):a Fano-Massey metric which allows to compare fairly sequences of different lengths.

4. The method according to any one of claims 2–3, wherein said set of stop conditions comprises the fact that the current top path contains the number of bits and the number of codewords of the variable-length soft-input codewords sequence (y [1:T]).

5. The method according to any one of the preceding claims 2–3, wherein the second subsequent stage of post-processing the stored intermediate data comprises the step of approximating each soft-output $\Lambda$(x [t]) for each bit by:

$$\Lambda(x[t]) = \mu(t, 0) - (t, 1)$$

where µ(t, 1) is the minimum cumulative metric for all the paths in the stack for which the t estimated bit is 1 and µ(t, 0) is the minimum cumulative metric for all the paths in the stack for which the t estimated bit is 0.

6. A computer program product stored on a computer readable medium for a decoder, comprising a set of instructions, which, when loaded into said decoder, configure the decoder to carry out each of the acts in any one of claims 1–3.

7. A computer product comprising a computer readable medium for a computer, comprising a set of instructions, which, when loaded into said computer, configure the computer to carry out each of the acts in any one of claim 1–3.

8. A Method for iterative decoding a variable-length soft-input sequence
(z [1:Tx n/k]) of Tx n/k bits comprising the following acts repeated for each iteration r:

computing a variable-length soft-output bit sequence ($\tilde{\Lambda}_c^{(r)}[1:T]$) by applying a channel decoding method using as input the variable-length soft-input sequence (z [1:Tx n/k]) and a priori probabilities ratio (φ (r−1) [1:T]) calculated for the previous iteration (r−1);

computing a variable-length soft-input codewords sequence ($y^{(r)}$ [t]) depending on the variable-length soft-output bit sequence ($\tilde{\Lambda}_c^{(r)}[1:T]$) provided by applying the channel decoding method;

computing a variable-length soft-output bit sequence ($\Lambda_v^{(r)}[t]$) by applying a method for source decoding according to any one of claims 1–3 using as input the variable-length soft-input codewords sequence (y(r)[t]) depending on the variable-length soft-output bit sequence ($\tilde{\Lambda}_c^{(r)}[1:T]$) provided by applying the channel decoding method; and computing the a priori probabilities ratio ($^{\Phi}$(r) [1:T]) depending on the variable-length soft-input bit sequence ($\Lambda_v^{(r)}[t]$) applied by said method for source decoding.

9. A receiver for iterative decoding a variable-length soft-input sequence (z [1:Tx n/k]) comprising means for implemented the following acts repeated for each iteration r:

computing a variable-length soft-output bit sequence ($\tilde{\Lambda}_c^{(r)}[1:T]$) by applying a channel decoding method using as input the variable-length soft-input sequence (z [1:Tx n/k]) and a priori probabilities ratio ($^{\Phi}$(r−1) [1:T]) calculated for the previous iteration (r−1);

computing a variable-length soft-input codewords sequence (y(r) [t]) depending on the variable-length soft-output bit sequence ($\tilde{\Lambda}_c^{(r)}[1:T]$) provided by applying the channel decoding method;

computing a variable-length soft-output bit sequence ($\Lambda_v^{(r)}[t]$) by applying a method for source decoding according to any one of claims 1–3 using as input the variable-length soft-input codewords sequence y(r)[t] depending on the variable-length soft-output bit sequence ($\tilde{\Lambda}_c^{(r)}[1:T]$) provided by applying the channel decoding method ; a computing the a priori probabilities ratio ($^{100}$ (r) [1:T]) depending on the variable-length soft-input bit sequence ($\Lambda_v^{(r)}[t]$) applied by said method for source decoding.

10. The method according to claim 1, wherein a position of each path listed in the stack other than the current path having a smallest cumulative metric is maintained when the stack is reordered.

11. The method according to claim 1, wherein if the last node of the current top path corresponds to a codeword, the method comprising the act of concatenating the unitary tree with the current tree by placing the initial node of the unitary tree at least at the last node of the current top path.

12. A method for source decoding a variable-length soft-input codewords sequence (y [1:T]) into a soft-output bit sequence ($\Lambda_v$ [1:T]), the variable-length soft-input input codewords sequence (y [1:T]) encoded in accordance with a VLC codewords table, the method comprising the acts of:

A. a first stage of implementing a stack decoding algorithm for a sequential estimation of a hard-output bit sequence of said variable length soft-input codewords sequence, including storage of intermediate data contained in the stack and generated by the stack decoding algorithm ; and B. a second subsequent stage of post-processing the stored intermediate data for generating the soft-output bit sequence ($\Lambda_v$ [1:T]), a soft-output ($\Lambda$(x [t])) being provided for each bit, wherein the second subsequent stage of post-processing the stored intermediate data comprises the step of approximating each soft-output $\Lambda$(x [t]) for each bit by:

$$\Lambda(x[t]) = \log(\Sigma e^{-\mu P_i} / \Sigma e^{-\mu P_i})$$

$$1 \leq i \leq r \quad 1 \leq i \leq r$$

$$T_{Pi} \geq t \quad T_{Pi} \geq t$$

$$\hat{x}_{Pi}[t]=1 \quad \hat{x}_{Pi}[t]=0$$

where Pi (i ∈ [1, . . . r]) are the r examined paths stored in the stack and μPi is the cumulative metric of path Pi, $T_{Pi}$ is the length of path Pi and x̂pi (t) is the $t^{th}$ hard bit of an hard bit sequence corresponding to path Pi.

13. A decoder apparatus for source decoding a variable-length soft-input codewords sequence (y [1:T]) into a soft-output bit sequence ($\Lambda_v$ [1:T]), the variable-length soft-input input codewords sequence (y [1:T]) encoded in accordance with a VLC codewords table, the decoder comprising:

means for implementing a stack decoding algorithm for a sequential estimation of an hard-output bit sequence of said variable length soft-input input codewords sequence, wherein at each step of the sequential estimation, a stack of paths is reordered placing a current path having a smallest cumulative metric among paths listed in the stack at a top of the stack, including storage means for storing intermediate data contained in the stack and generated by the stack decoding algorithm; and means for post-processing the stored intermediate data for generating the soft-output bit sequence ($\Lambda_v$ [1:T]), a soft-output ($\Lambda$(x [t])) being provided for each bit.

14. A program stored on a computer readable medium arranged for source decoding a variable-length soft-input codewords sequence (y [1:T]) into a soft-output bit sequence ($\Lambda_v$ [1:T]), the variable-length soft-input input codewords sequence (y [1:T]) encoded in accordance with a VLC codewords table, the apparatus comprising:

a program portion configured to implement a stack decoding algorithm for a sequential estimation of a hard-output bit sequence of said variable length soft-input codewords sequence, wherein at each step of the sequential estimation, a stack of paths is reordered placing a current path having a smallest cumulative metric among paths listed in the stack at a top of the stack, including storage of intermediate data contained in the stack and generated by the stack decoding algorithm; and a program portion configured to post-process the stored intermediate data for generating the soft-output bit sequence ($\Lambda_v$ [1:T]), a soft-output ($\Lambda$(x [t])) being provided for each bit.

15. The program of claim 14, wherein a position of each path listed in the stack other than the current path having a smallest cumulative metric is maintained when the stack is reordered.

16. The program of claim 14, wherein if the last node of the current top path corresponds to a codeword, the program comprising a program portion configured to concatenate the unitary tree with the current tree by placing the initial node of the unitary tree at least at the last node of the current top path.

* * * * *